United States Patent [19]

Fujimoto

[11] 4,365,348
[45] Dec. 21, 1982

[54] TUNING VOLTAGE GENERATING APPARATUS OF VOLTAGE SYNTHESIZER TYPE

[75] Inventor: Isao Fujimoto, Katano, Japan

[73] Assignee: Sanyo Electric Co., Ltd., Moriguchi, Japan

[21] Appl. No.: 214,872

[22] Filed: Dec. 10, 1980

[30] Foreign Application Priority Data

Dec. 17, 1979 [JP] Japan .................. 54-1751491[U]
Feb. 8, 1980 [JP] Japan .................. 55-14950

[51] Int. Cl.³ ............................................. H04B 1/26
[52] U.S. Cl. ..................................... 455/180; 334/15; 455/195
[58] Field of Search ............. 455/169, 179, 180, 185, 455/186, 195; 334/15

[56] References Cited

U.S. PATENT DOCUMENTS 4,017,800  4/1977  Champagne ................. 455/185

Primary Examiner—Marc E. Bookbinder
Attorney, Agent, or Firm—Armstrong, Nikaido, Marmelstein & Kubovcik

[57] ABSTRACT

A tuning voltage generating apparatus of a voltage synthesizer type comprises a voltage converter which converts into a reference voltage a voltage level of an input pulse signal having a pulse width corresponding to a frequency to be received and a low-pass filter which converts the pulse signal voltage converted by the voltage converter into a direct current voltage which is withdrawn as a tuning voltage. A reference voltage applied to the voltage converter is generated by dividing a voltage stabilized by a constant voltage diode using a resistor. A resistor voltage divider circuit determines the upper limit of the tuning voltage obtained from the low-pass filter. Two kinds of reference voltages having different levels may be generated as a reference voltage and switched associated with band switching.

10 Claims, 26 Drawing Figures

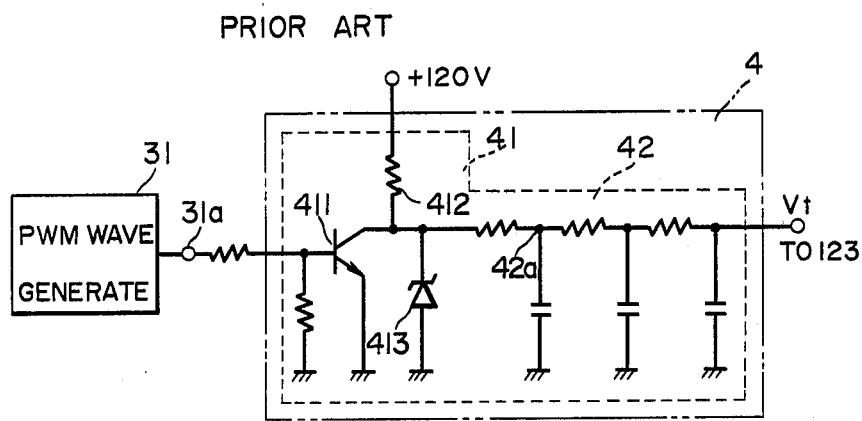
FIG. 2 PRIOR ART
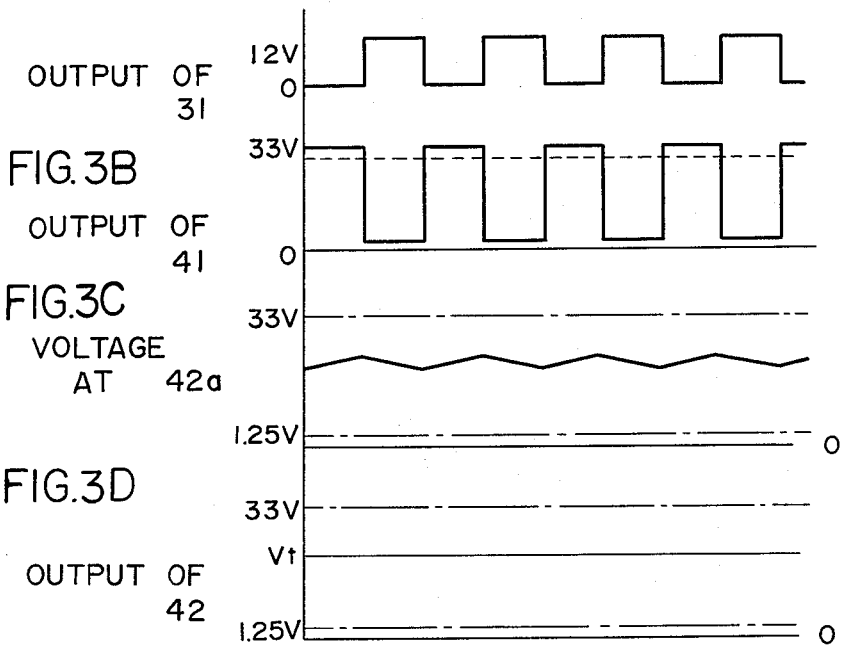
FIG. 3A PRIOR ART — OUTPUT OF 31
FIG. 3B — OUTPUT OF 41
FIG. 3C — VOLTAGE AT 42a
FIG. 3D — OUTPUT OF 42

TUNING VOLTAGE GENERATING APPARATUS OF VOLTAGE SYNTHESIZER TYPE

BACKGROUND OF THE INVENTION

1. Field of the Invention

The present invention relates to a tuning voltage generating apparatus. More specifically, the present invention relates to a tuning voltage generating apparatus of a voltage synthesizer type for supplying a tuning voltage to a tuner employing a variable reactance element as a tuning element.

2. Description of the Prior Art

FIG. 1 is a block diagram showing a major portion of a conventional television receiver. Since such television receiver is well-known to those skilled in the art, only those portions associated with the present invention will be briefly described. A tuner 100 comprises two input terminals 117 and 119. The input terminal 117 is connected to receive a television signal received by a VHF antenna 1. The input terminal 119 is connected to receive a television signal received by a UHF antenna 2. The received signal from the VHF antenna input terminal 117 is applied to a VHF high frequency amplifier 103 and is amplified and the amplified output therefrom is applied to a VHF mixer 105. The tuner 100 also comprises a VHF local oscillator 107. The oscillation output of the VHF local oscillator 107 is applied to a VHF mixer 105. Accordingly, the VHF mixer 105 serves to mix the VHF television signal with the oscillation output from the VHF local oscillator 107, thereby to convert the VHF television signal into a VHF intermediate frequency signal. On the other hand, the received signal applied to the UHF antenna input terminal 119 is applied to a UHF high frequency amplifier 109 and is amplified and the amplified output therefrom is applied to a UHF mixer 111. The tuner 100 also comprises a UHF local oscillator 113 and the oscillation output therefrom is applied to a UHF mixer 111. Accordingly, the UHF mixer 111 serves to mix the UHF television signal with the oscillation output from the UHF local oscillator 113, thereby to convert the UHF television signal into a UHF intermediate frequency signal. The output from the UHF mixer 111, i.e. the UHF intermediate frequency signal is amplified by a UHF intermediate frequency amplifier 115 and is applied to a VHF mixer 105. On the occasion of reception of the UHF signal, the VHF high frequency amplifier 103 and the VHF local oscillator 107 are disabled, while the VHF mixer 105 is kept enabled. Accordingly, on the occasion of reception of the UHF signal, the VHF mixer 105 serves as a UHF intermediate frequency amplifier for amplifying the UHF intermediate frequency signal. Meanwhile, on the occasion of reception of the VHF signal, those circuits 109, 111, 113 and 115 associated with the UHF signal are all disabled, while only those circuits 103, 105 and 107 associated with the VFH signal are enabled. The VHF intermediate frequency signal or the UHF intermediate frequency signal obtained from the VHF mixer 105 is applied from the output terminal 121 to the subsequent stage intermediate frequency circuit, not shown. These circuits 103 to 115 are housed within a shield member 101 of such as a metallic casing or frame. Therefore, any undesired radiation from those circuits housed within the shield member 101 toward other wireless equipment is effectively prevented, while any undesired electric wave or interference electric wave from other wireless equipment to those circuits is also effectively prevented. The above described antenna input terminals 117 and 119 and the intermediate frequency output terminal 121 are formed at predetermined positions of the shield member 101, while these terminals are electrically isolated from the shield member 101.

The VHF high frequency amplifier 103, the VHF local oscillator 107, the UHF high frequency amplifier 109 and the UHF local oscillator 113 each comprise a tuning circuit, not shown, for varying the tuning frequency for selection of a desired channel within a desired receiving frequency band. Each of these tuning circuits comprises a voltage controlled variable reactance device such as a voltage controlled variable capacitance diode. To that end, the tuner 100 housed in the shield member 101 is also provided with a tuning voltage input terminal 123, as electrically isolated from the shield member 101, for supply of the tuning voltage Vt. The tuning voltage Vt from the terminal 123 is applied to the associated circuits 103, 107, 109 and 113. The shield member 101, i.e. the tuner 100, further comprises a test point (TP) terminal 127, as electrically isolated from the shield member 101, for supply of the output from the tuner 100 to alignment equipment, not shown, for alignment of the output waveform on the occasion of adjustment of the tuner 100. In general, the VHF band comprises a VHF low band (the first band) of a relatively low frequency range and a VHF high band (the second band) of a relatively high frequency range. On the other hand, the UHF band may be considered as the third band of a frequency range higher than that of the VHF high band. Accordingly, the tuner 100 further comprises terminals 129, 131 and 133, as electrically isolated from the shield member 101, for supply of voltage signals for selection of these frequency bands. More specifically, the terminal 129 is aimed to supply a band selection voltage BL for selection of the VHF low band, the terminal 131 is aimed to provide a band selection voltage BH for selection of the VHF high band, and the terminal 133 is aimed to provide a band selection voltage BU for selection of the UHF band. The tuner 100 further comprises a terminal 125 for supply of an automatic gain control (AGC) voltage obtained from the intermediate frequency circuit, not shown, and a terminal 135 for supply of an automatic fine tuning (AFT) voltage, both electrically isolated from the shield member 101. Each of the terminals 129, 131 and 133 is supplied with the band selection voltage BL, BH or BU of +15 V, when the corresponding receiving frequency band is to be selected. Each of the tuning circuits included in the tuner 100 is structured to be responsive to the given band selection voltage BL, BH or BU to change the circuit constant or circuit connection of the tuning scheme so as to be adaptable to the corresponding frequency band, as well-known to those skilled in the art.

The above described tuning voltage Vt is supplied from a tuning voltage generating circuit 4. The band selection voltage BL, BH or BU is supplied from a band selection voltage generating circuit 5. The tuning voltage generating circuit 4 and the band selection voltage generating circuit 5 are supplied with a signal from a channel selector 3. The channel selector 3 includes, for example, a keyboard, a necessary operating switch and the like (not shown). The channel selector 3 further comprises a PWM wave generating circuit 31 (FIG. 2), control means, not shown, for controlling the same, and the like. If and when the keyboard (not shown), is operated so as to select a desired channel, an input pulse signal having a pulse width corresponding to that channel, that is, a frequency to be received is generated from the PWM wave generating circuit 31. At the same time, the band selection voltage circuit 5 generates the band selection voltage BL, BH or BU so as to enable the receiving band belonging to the desired channel. The tuning voltage generating circuit 4 includes a voltage converter 41 and a low-pass filter 42 as shown in FIG. 2. As a result, the tuning voltage generating apparatus in FIG. 1 is structured to be of a voltage synthesizer type.

Such a tuning voltage generating apparatus of a voltage synthesizer type is well-known to those skilled in the art and, for example, is disclosed in U.S. Pat. No. 3,968,440 issued to George John Ehni, III on July 6, 1976 and the like. Briefly stated, the voltage converter 41 comprises a transistor 411, a resistor 412 connected to the collector of the transistor 411 and a constant voltage diode 413. An input pulse signal from an output terminal 31a of the PWM wave generating circuit 31 has a pulse width corresponding to a desired channel (FIG. 3A). Such an input pulse signal is converted into a higher level pulse signal as shown in FIG. 3B. At this time, the resistor 412 and the constant voltage diode 413 cooperate with each other to restrict the collector voltage of the transistor 411 to, for example, approximately 33 V. The output of the low-pass filter 42 having the output voltage from the voltage converting circuit 41 is used as a tuning voltage Vt of a direct current voltage, as shown in FIG. 3D. FIG. 3C shows a voltage waveform in the point 42a included within the filter 42.

A so-called autosearch operation as shown in FIG. 4A and FIG. 4B can be made by using the tuning voltage generating apparatus as shown in FIG. 1 and FIG. 2. In an autosearch mode, the band selection voltage generating circuit 5 generates the band selection voltage BL, BH or BU as shown in FIG. 1 and FIG. 4B. On the other hand, the PWM wave generating circuit 31 (FIG. 2) applies to the tuning voltage generating circuit 4 an input pulse signal the pulse width of which sequentially becomes wider. By doing so, a gradually increasing tuning voltage Vt as shown in FIG. 4A is obtained for each band from the tuning voltage generating circuit 4. As a result, a tuning frequency of a tuning element, not shown, included in the tuner 100 gradually becomes higher and a desired autosearch operation can be achieved.

The above described tuning voltage Vt was determined in accordance with the following condition. In the following, therefore, such determination of the tuning voltage will be described with reference to an example of a television tuner in Europe, as shown in FIG. 5. Referring to FIG. 5, the abscissa indicates the tuning voltage and the ordinate indicates the respective channels in the VHF low band, the VHF high band and the UHF band. In Europe, for example, the VHF low band (the first band) covers channels E2 to E4, while the VHF high band (the second band) covers channels E5 to E12. The UHF band (the third band) covers channels E21 to E69. Such tuner has been designed such that the lower limit frequency of the VHF low band may be determined so that channel E2 can be received when the tuning voltage Vt is 3 V, for example. However, a television tuner must be capable of surely selecting channel E2 even in any situation and even in the worst condition. More specifically, in consideration of a frequency drift due to a source voltage fluctuation, an ambient temperature variation, a time dependent change and so on, a frequency deviation due to a mechanical shock, and the like, the television tuner must be designed to be capable of surely receiving channel E2 even in the worst condition which seldom occurs. Therefore, according to a conventional approach, the tuner 100 was designed such that the tuning voltage Vt which is as low as 0.2 to 0.3 V, for example, and is sufficiently lower than the above described 3 V, may be supplied from the tuning voltage generating circuit 4. As a result, with such a conventional television tuner, the receivable frequency range extended over the lower region beyond the necessary receivable frequency range shown by the dotted line in FIG. 5 in a normal use condition. For example, a conventional tuner was adapted such that in the case of the VHF low band shown in FIG. 5 the signal can be received even when the frequency becomes lower than that of channel E2 by a frequency difference corresponding to approximately one channel. A conventional tuner was further adapted such that in the case of the VHF high band the signal can be received even when the frequency becomes lower than the lower limit channel E5 by a frequency difference corresponding to approximately six channels. A conventional tuner was further adapted such that in the case of the UHF band the signal can be received even when the frequency becomes lower than the lower limit channel E21 by a frequency difference corresponding to approximately ten channels. A conventional television tuner was further adapted such that as for the upper limit of the respective bands as well the signal of any desired receiving frequency band can be surely received with a sufficient margin in full consideration of any imaginable worst condition. The consideration is paid such that the margin is approximately two channels over E4 channel in the case of VHF low band, approximately three channels over E13 channel in the case of VHF high band and approximately ten channels over E69 channel in the case of UHF band, respectively.

However, for the purpose of effective utilization of the electric wave and observance of secrecy of communication, in some countries there have been tendencies to restriction of reception by a tuner beyond the receivable frequency range in a television receiver, for example. More specifically, some countries have shown tendencies to legislation to restrict the receivable frequency range by a tuner in a television receiver at the upper and lower limits of the respective receiving frequency bands as shown in FIG. 5, with a margin frequency corresponding to one channel, respectively.

For example, in West Germany, the FTZ (Fermnelde Technisches Zentralamt) has made the following proposal in the draft of January, 1979. More specifically, in West Germany the frequency range for the television broadcasting has been determined such that the Band I covers 47 MHz to 68 MHz, the Band III covers 174 MHz to 230 MHz and the Band IV and V cover 470 MHz to 790 MHz. A deviation allowance outside the frequency range at each of the upper and lower limits of the frequency range of each band has been determined in principle as 300 kHz. By way of an exception, as for the receiving frequency band of 47 MHz to 870 MHz, a deviation allowance outside the frequency range has been determined as 7 MHz at the lower limit of the frequency range and as 8 MHz at the upper limit of the frequency range.

An attempt has also been made to make similar restriction in the case of the Canadian television broadcasting shown in FIG. 6. According to the Canadian television broadcasting standard, the VHF low band comprises Channel Nos. 2 to 6, the VHF high band comprises Channel Nos. 7 to 13, and the UHF band comprises Channel Nos. 14 to 84. According to the draft of October, 1978 by the Canadian DOC (Department of Communications) and the further developments thereof, the following restriction has been planned. More specifically, according to the Canadian television broadcasting standard, the channels for the CATV have been allotted in the region lower than Channel No. A7 and in the region higher than Channel No. 13. Therefore, a restriction has been planned in Canadian television receivers such that some of the CATV channels allotted in the region lower than Channel No. A7 and in the region higher than Channel No. A13 are made absolutely unreceivable. More specifically, television receivers originally not designed to receive such CATV broadcasting are sufficient enough to be capable of surely receiving only the television signal of Channel Nos. A2 to A6, Nos. A7 to A13, and Nos. A14 to A83 and therefore a restriction has been planned to make such receivers incapable of receiving a signal in Channels A to I of the CATV channels in the region lower than Channel No. A7 and a signal in CATV Channels A to W in the region higher than Channel No. A13. In making such restriction, however, one channel, i.e. Channel I in the region immediately lower than Channel No. A7 and one channel, i.e. Channel J in the region immediately higher than Channel No. A13 have been considered as allowable for a deviation range.

As described in the foregoing, in some countries there have been tendencies to a strict restriction to a deviation downward or upward from the original receiving frequency band, for the purpose of effective utilization of an electric wave and observance of communication secrecy.

The above described upper limit of receiving frequency is determined depending on variation range of the tuning voltage Vt. In a conventional tuning voltage generating apparatus of a voltage synthesizer type as shown in FIG. 2, a variation range of the tuning voltage and thus the upper limit thereof is determined depending on the constant voltage diode 413. Such constant voltage diode 413 requires good temperature characteristic and as a result, those put into practical use based on current technical level are μPC-574J manufactured by Nippon Electric Co., Ltd. and the like. The operating voltage of this μPC-574J may be diversified in the range of 33 V±3 V according to the standard thereof. More specifically, the operating voltage of the constant voltage diode 413 such as μPC-574J causes diversification in the range of 30 V to 36 V. Accordingly, the upper limit of the tuning voltage from the tuning voltage generating circuit as shown in FIG. 2 correspondingly diversifies.

Therefore, for example, assuming a television tuner for only West Germany, the standard of FTZ can be met in the diversification range of the operating voltage of the above described constant voltage diode 413 if the tuner 100 is preset or adjusted so that the E65 channel, for example, can be received at the upper limit of the tuning voltage Vt.

However, in a television receiver for European countries other than West Germany, since those channels up to the E69 channel must be able to be received, the constant voltage diode, μPC-574J, having the above described range of the operating voltage cannot be employed. The reason is that in order to be able to receive the channels up to the E69 channel of the UHF band, the margin of ±5 MHz is needed in consideration of the above described frequency fluctuation factors. Thus, if an attempt is made to be able to receive the E69 channel with the margin of ±5 MHz, the operating voltage of the constant voltage diode 413 must be restricted to approximately 33 V±0.6 V, for example. However, under the existing circumstances, such a constant voltage diode having a narrow width of the operating voltage and various good characteristics such as temperature characteristic has not been put into practical use. Accordingly, under the existing circumstances, this is only the way in which a constant voltage diode such as the above described μPC-574J is selected. It is clear that selection of the operating voltage is not suitable for mass production and is not practical.

On the other hand, the tuning voltage Vt applied to the tuner not only determines the receiving frequency range, but also causes the response and gain of the tuner to change respectively. Tracking adjustment must be made in the tuner so as to obtain a good and stable response and gain over the frequency variation range in each band. Thus, restriction of the tuning voltage Vt to some range, for example, 33 V±0.6 V in making the tracking adjustment remarkably reduced freedom for the tracking adjustment. As a result, even this approach introduces defects that mass production cannot be achieved and freedom for adjustment of the tuner in the course of manufacturing process is restricted. Under the existing circumstances, a tuning voltage generating apparatus has not been obtained which is capable of receiving up to the E69 channel of the UHF band, for example, using a conventional tuning voltage generating circuit of a voltage synthesizer type and in addition, can fully satisfy the standard of FTZ.

SUMMARY OF THE INVENTION

Briefly described, the present invention is directed to a tuning voltage generating apparatus of a voltage synthesizer type which voltage converts an input pulse signal by a reference voltage into a direct current voltage thereby to generate a tuning voltage. The reference voltage applied to voltage converting means is generated by a reference voltage generating means. The reference voltage generating means comprises a constant voltage element and voltage dividing means and divides the voltage stabilized by the constant voltage element by the voltage dividing means to generate the said reference voltage. In accordance with the present invention, a tuning voltage generating apparatus satisfying the standards such as FTZ and DOC can be readily achieved using common constant voltage elements by adequately adjusting a dividing ratio in the voltage dividing means.

In a preferred embodiment of the present invention the reference voltage generating means generates first and second reference voltages. The inventive tuning voltage generating apparatus further comprises means for switching receiving bands and one of said first and second reference voltages is provided to the voltage converting means responsive to the output from the receiving band switching means. In accordance with this preferred embodiment, in any one of a plurality of receiving bands, it is possible to restrict the upper limit of the tuning voltage independent of the others. Accordingly, it is possible to securely restrict a maximum receivable frequency for the receiving band without any modification in a tuner side.

Accordingly, a principal object of the present invention is to provide a tuning voltage generating apparatus of a voltage synthesizer type which is capable of arbitrarily adjusting the upper limit of the generated tuning voltage.

Another object of the present invention is to provide a tuning voltage generating apparatus of a voltage synthesizer type which is capable of easily adjusting a maximum receivable frequency using a conventional tuner without much alteration in the tuner side.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit showing in detail a conventional tuning voltage generating circuit of a voltage synthesizer type;

FIGS. 3A to 3D are waveforms for explaining the operation of FIG. 2;

DESCRIPTION OF THE PREFERRED EMBODIMENTS

Figure 7:
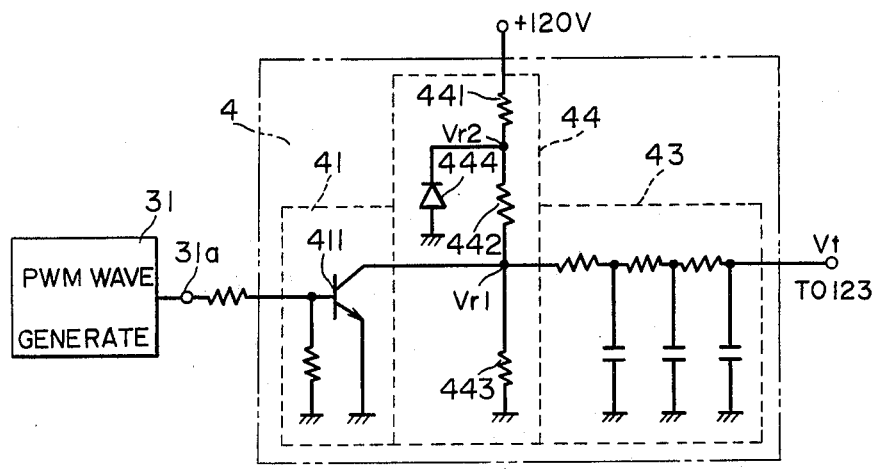
FIG. 7 is a circuit showing a major portion of one embodiment of the present invention.

FIG. 7 is a circuit showing a major portion of one embodiment of the present invention. The FIG. 7 embodiment is different in structure from a conventional circuit as shown in FIG. 2 in that a reference voltage generating circuit 44 is interposed between a voltage converting circuit 41 and a low-pass filter 43. This reference voltage generating circuit 44 comprises a series connection of resistors 441, 442 and 443 interposed between a positive voltage (+120 V) and the electrical ground. These resistors 441, 442 and 443 connected in series constitute a voltage divider. A constant voltage diode 444 such as μPC-574J manufactured by Nippon Electric Co., Ltd. is connected between a series junction of the resistors 441 and 442 and the electric ground. Reference voltages Vr1 and Vr2 appear at the respective series junctions of these resistors 441, 442 and 443 connected in series. The voltage Vr2 is set too, for example, 33 V depending on the characteristic of the constant voltage diode 444. This voltage Vr2 is divided by the resistors 442 and 443. Accordingly, a voltage, for example, 27.5 V is obtained as the voltage Vr1. This voltage Vr1 acts as a first reference voltage.

Figure 8A:
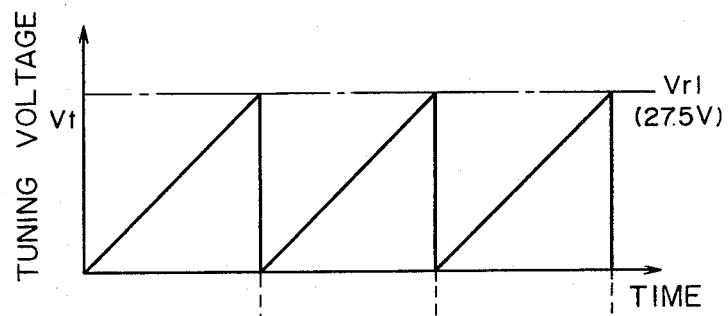
FIGS. 8A and 8B are waveforms for explaining the autosearch operation in FIG. 7.
Figure 8B:
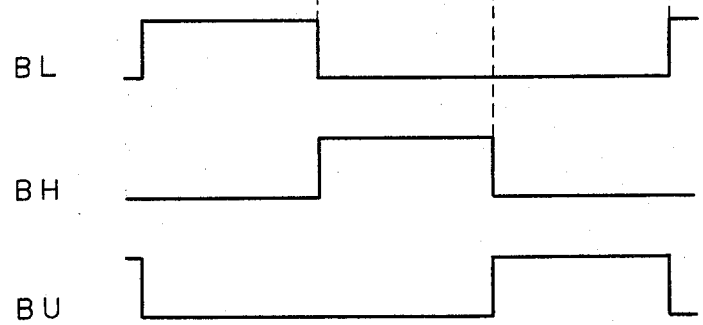
Figure 9:
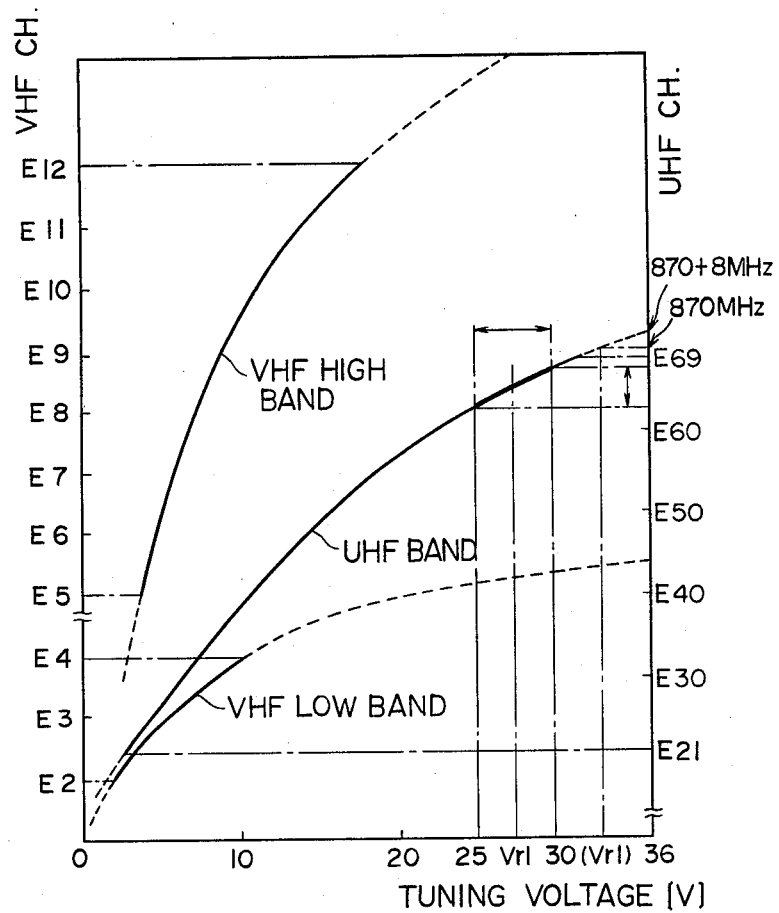
FIG. 9 is a graph showing a relation between the tuning voltage and the receiving channel in accordance with FIG. 7 embodiment and corresponds to FIG. 5.

Normally, the zener voltage of the constant voltage diode 444 is in the range of 33 V±3 V, as described in the foregoing. Accordingly, the above described reference voltage Vr1 is 27.5 V±2.5 V. Therefore, as shown in FIGS. 8A and 8B, the upper limit of the tuning voltage Vt is in the range of approximately 25 to 30 V. Thus, restriction of the upper limit of the tuning voltage Vt to the reference voltage Vr1 keeps FTZ standard as shown in FIG. 9. In addition, the channels below E60 in the UHF band required in West Germany can be received without any troubles, since the tuning voltage Vt is restricted to 30 V even if the operating voltage of the constant voltage diode 444 is the upper limit (36 V) in the case of the upper limit of diversification, while the tuning voltage Vt does not fall below 25 V even in the case of the lower limit of diversification of the operating voltage of the constant voltage diode 444. If and when the tuning voltage Vt is 30 V, the E68 channel is received in the UHF band and if and when the tuning voltage Vt is 25 V, the E63 channel is received. Accordingly, according to this FIG. 7 embodiment, a television receiver can be obtained as a television receiver for use in West Germany which fully satisfies FTZ and is capable of securely receiving the channel up to E60 channel.

Figure 10:
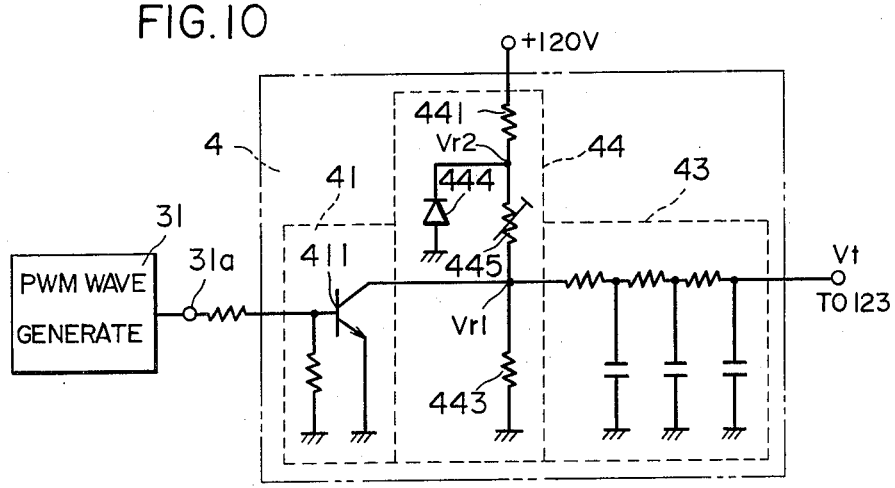
FIG. 10 is a circuit showing a major portion of another embodiment of the present invention.

Incidentally, the channel which must be able to be received in the UHF band is E69 channel in European countries other than West Germany. Therefore, according to the FIG. 7 embodiment, there is some possibility that higher channels in the UHF band may not be received. Accordingly, in the embodiment shown in FIG. 10, a variable resistor or semi-fixed resistor 445 is employed instead of the resistor 442 (FIG. 7). The above described μPC-574J, for example is used as the constant voltage diode 444. In manufacturing the tuning voltage generating apparatus using such reference voltage generating circuit 44, the semi-fixed resistor 445 is adjusted so that the reference voltage Vr1 is 33 V. On the other hand, in manufacturing a tuner 100 (FIG. 1), the channel of the UHF band, not shown, is set so as to be able to receive the maximum frequency and thereafter this reference voltage Vr1 (27.5 V) is supplied with a terminal 123 (FIG. 1) and with this condition the UHF local oscillator 113 (FIG. 1) of the tuner 100 is adjusted so that 870 MHz can be received. As can be seen from FIG. 9, this frequency 870 MHz is 8 MHz higher than the frequency of the E69 channel and 8 MHz lower than the upper limit of the FTZ standard (that is, 870 MHz+8 MHz). As a result, even in consideration of various frequency fluctuation factors described in the foregoing, the E69 channel can be securely received and the FTZ standard is securely kept.

Figure 11:
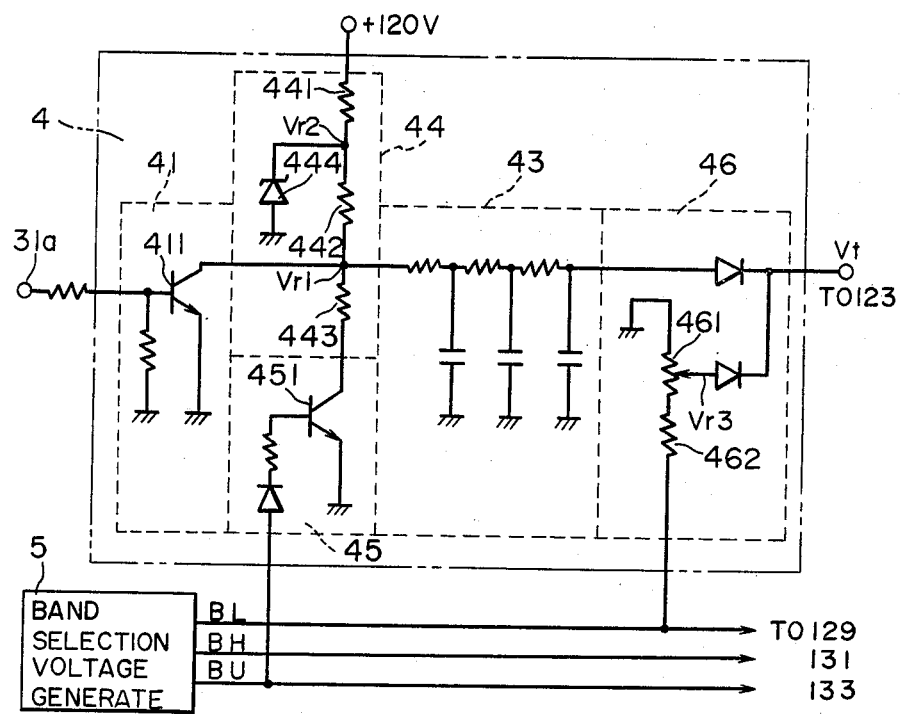
FIG. 11 is a circuit showing a major portion of further preferred embodiment of the present invention.

FIG. 11 is a circuit showing a major portion of a further embodiment of the present invention. This FIG. 11 embodiment makes effective restriction of a tuning voltage Vt as described in the foregoing only in the case of a particular band. This embodiment is the same structure as that of the FIG. 7 embodiment except for the following points. More particularly, in FIG. 11 embodiment, a switching circuit 45 is provided for switching reference voltage Vr1 or Vr2 in the reference voltage generating circuit 44. In addition, a reference voltage generating circuit 46 for generating a third reference voltage Vr3 is provided in the post stage of the low-pass filter 43. The switching circuit 45 comprises a transistor 451 the collector of which is connected to one end of a resistor 443 constituting a voltage divider and the emitter of which is grounded. The base of the transistor 451 is connected to one output terminal of the band selection voltage generating circuit 5 through a resistor and diode. This output terminal withdraws the band selection voltage BU for setting the UHF band. On the other hand, the reference voltage generating circuit 46 comprises a series connection of a variable resistor 461 and a resistor 462. One end of this variable resistor 461 is connected to the electrical ground and other end thereof is connected to the resistor 462. The other end of the resistor 462 is connected to other output terminal (which outputs the voltage BL) of the band selection voltage generating circuit 5.

Figure 12A:
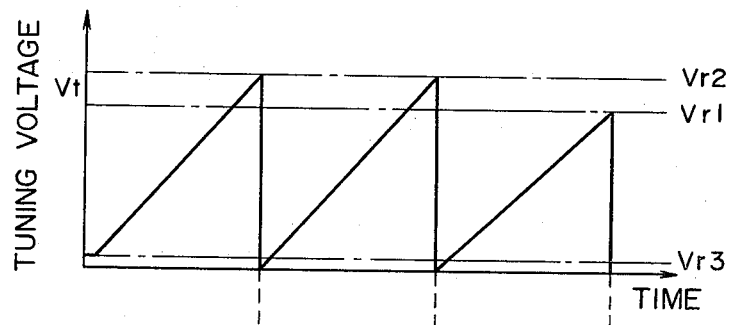
FIGS. 12A and 12B are waveforms for explaining the autosearch operation of FIG. 11 embodiment.
Figure 12B:
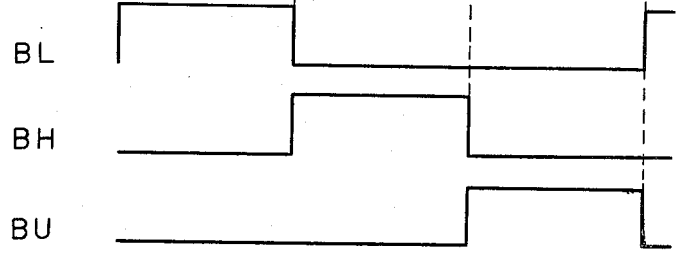

In operation, in receiving the VHF low band, a signal BL from the band selection voltage generating circuit 5 is outputted as shown in FIG. 12B. This band selection voltage BL is approximately 15 V as well as other voltages BH and BU. As a result, this voltage BL of 15 V is applied to the voltage divider in the reference voltage generating circuit 46. Under the circumstances, if and when the slider of the variable resistor 461 is set to a suitable position, 1.5 V, for example, is outputted as the reference voltage Vr3. On the other hand, in receiving the VHF low band, the transistor 451 included in the switching circuit 45 is not rendered conductive as in the case where VHF high band is received. Correspondingly, the voltage divider included in the reference voltage generating circuit 44 cannot be activated. Accordingly, the voltage Vr2 is supplied to the voltage converting circuit 41 as a reference voltage from the reference voltage generating circuit 44. As described in the foregoing, the second reference voltage Vr2 is in the range of 30 to 36 V. Therefore, in receiving this VHF low band, for example in the autosearch operation mode, that tuning voltage Vt varies from the reference voltage Vr3 (for example, 1.5 V) to Vr2 (for example, 33 V), as shown in FIG. 12A.

In receiving the VHF high band, since neither of the above described switching circuit 45 and reference voltage generating circuit 46 is activated, its tuning voltage Vt varies from the lower level of approximately 0.2 V for example to the second reference voltage Vr2 (for example, 33 V).

In the case where the UHF band is received, the voltage BU of approximately 15 V is outputted from the band selection voltage generating circuit 5. Accordingly, the transistor 451 included in the switching circuit 45 is rendered conductive. As a result, the voltage divider included in the reference voltage generating circuit 44 is activated and the circuit 44 provides Vr1 as a reference voltage to the voltage converting circuit 41. The reference voltage Vr1 is set to approximately 27.5 V as in the case of the previous FIG. 7 embodiment.

Figure 13:
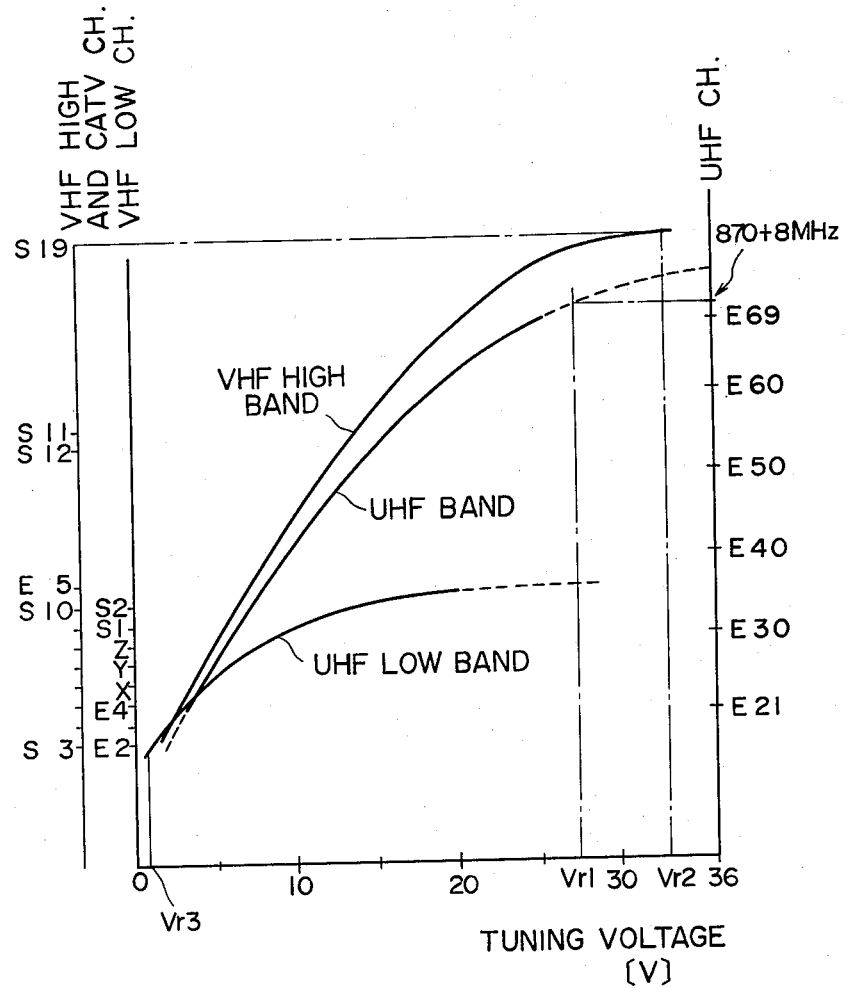
FIG. 13 is a graph showing a relation between the tuning voltage and the receiving channel in FIG. 11 embodiment, and corresponds to FIG. 9.

Thus, the first reference voltage Vr1 is in the range of 25 V to 30 V. On the other hand, in receiving the UHF band, no voltage is applied to the reference voltage generating circuit 46 as in the case of receiving the VHF high band as described in the foregoing. Therefore, in the FIG. 11 embodiment, in receiving the UHF band, its tuning voltage Vt varies, as shown in FIG. 12A, from approximately 0.2 V, for example, to Vr1 (for example, 27.5 V). Accordingly, if and when the tuning voltage Vt is the first reference voltage Vr1, the tuner 100 (FIG. 1) may be adjusted so as to be capable of receiving 870 MHz of the UHF band. In this way, the FIG. 11 embodiment is particularly effective for a television receiver which must be able to receive the CATV band adjoining the VHF high band, as shown in FIG. 13. More specifically, in Europe, for example, the CATV band is included in the same receiving band as the VHF high band. The tuner 100 is generally structured such that the S19 channel of the CATV band cannot be received unless 33 V is provided as a tuning voltage Vt. On the other hand, in the case of the UHF band, as described in the foregoing, if and when a tuning voltage Vt is over 33 V, then the upper limit of the standard of FTZ is exceeded. Under the circumstances, there is a requirement that a higher tuning voltage can be provided in the VHF high band while the tuning voltage is restricted to a lower voltage in the UHF band. In order to satisfy such a requirement, the FIG. 11 embodiment can provide a second reference voltage Vr2 as a reference voltage to the voltage converting circuit 41 in the VHF high band and provide a first reference voltage Vr1 to the circuit 41 in the UHF band.

Figure 1:
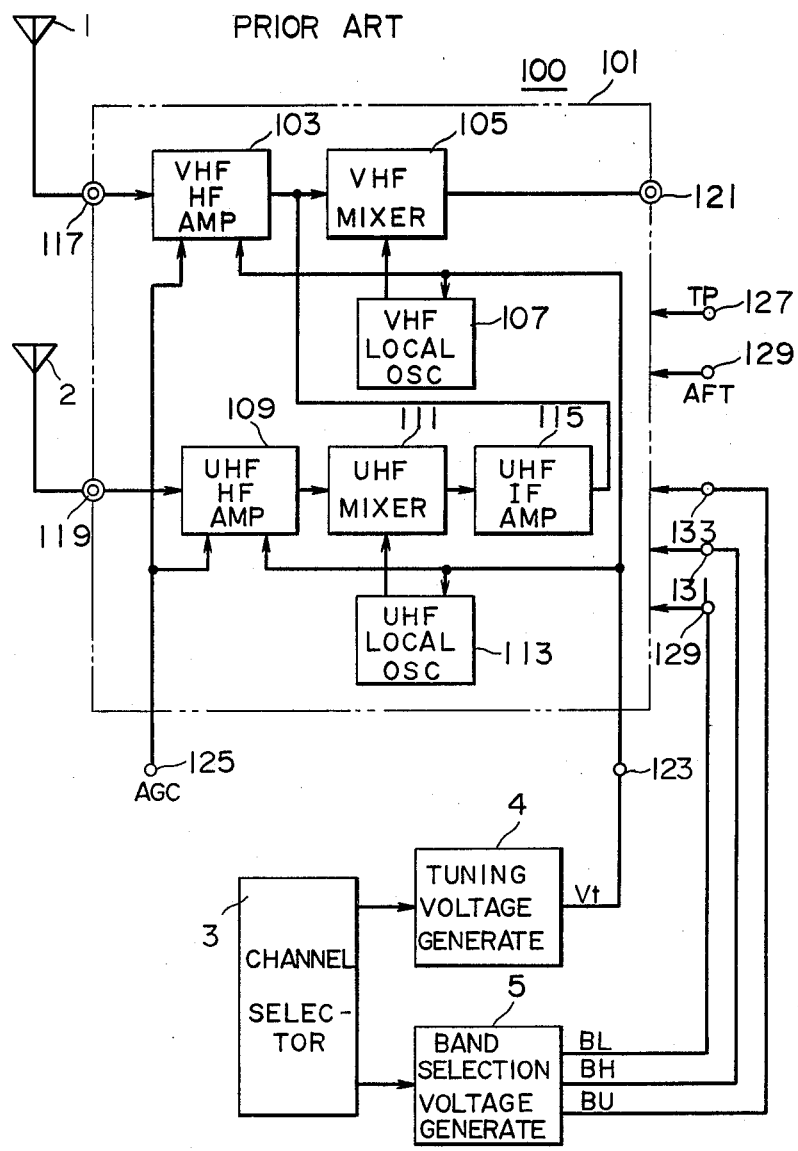
FIG. 1 is a block diagram showing a major portion of one example of a television receiver which is a background of the invention and wherein the present invention can be advantageously employed.
Figure 4A:
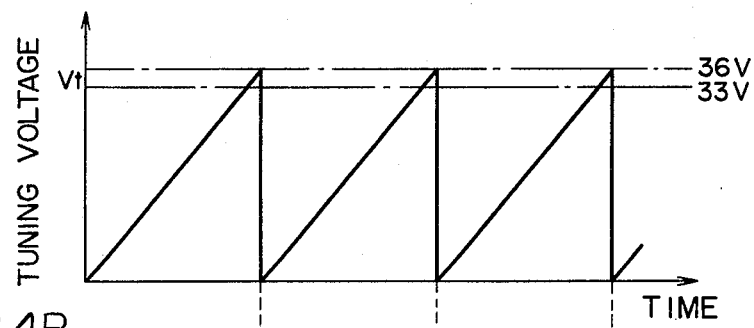
FIGS. 4A and 4B are waveforms for explaining the operation of the autosearch.
Figure 4B:
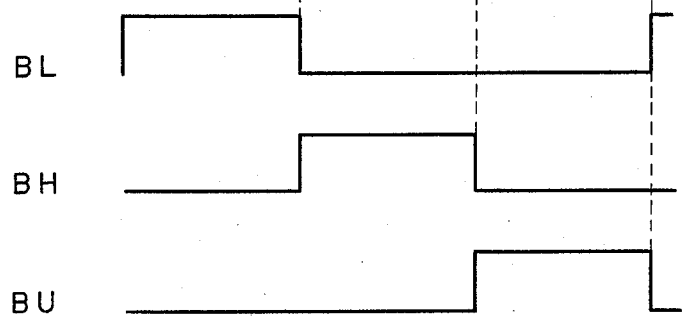
Figure 5:
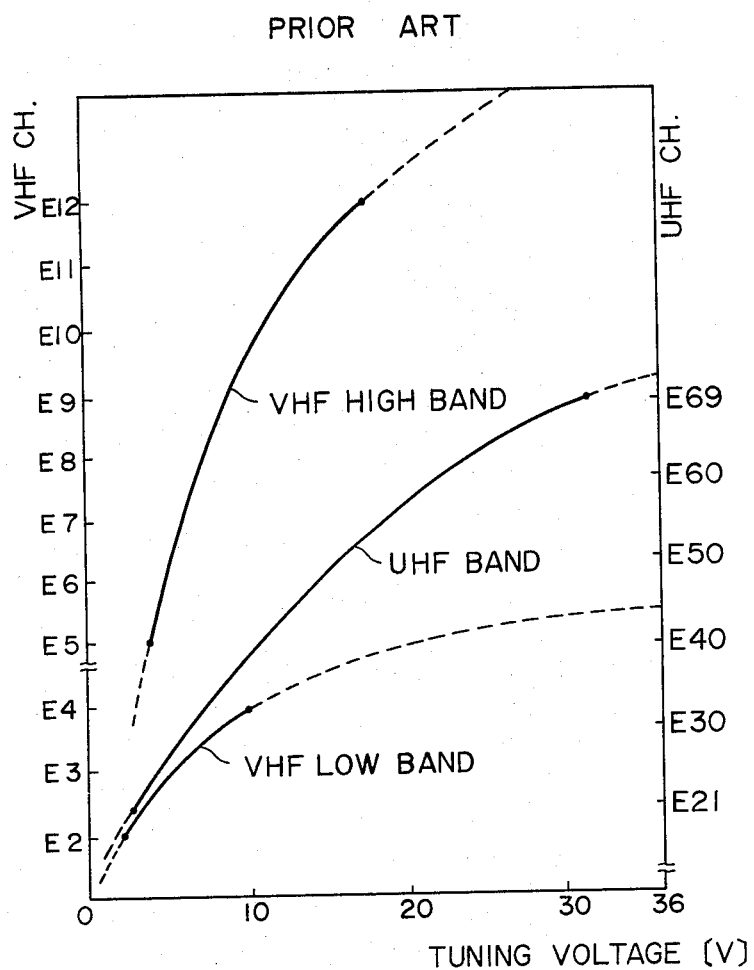
FIG. 5 and FIG. 6 are graphs for explaining the standards of FTZ and DOC, respectively.

The reason why the lower limit of the tuning voltage Vt is restricted to approximately 1.5 V in the VHF low band will be described in the following. More specifically, in the VHF low band, too low a tuning voltage Vt lowers performance, particularly, quality factor of the tuner 100 (FIG. 1). On the other hand, too high a lower limit of the tuning voltage Vt causes lack of capacitance of a variable capacitance diode, not shown, as a variable reactance element in the VHF low band. In the VHF low band, if and when the lower limit of the tuning voltage Vt is restricted to approximately 1.5 V and in adjusting the tuner 100 the tuner 100 is adjusted so as to be capable of receiving approximately 4 MHz lower frequency than that of the E2 channel, then the situation where the E2 channel cannot be received is not caused even in consideration of various frequency fluctuation factors.

Figure 6:
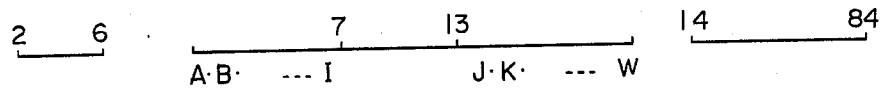
Figure 14:
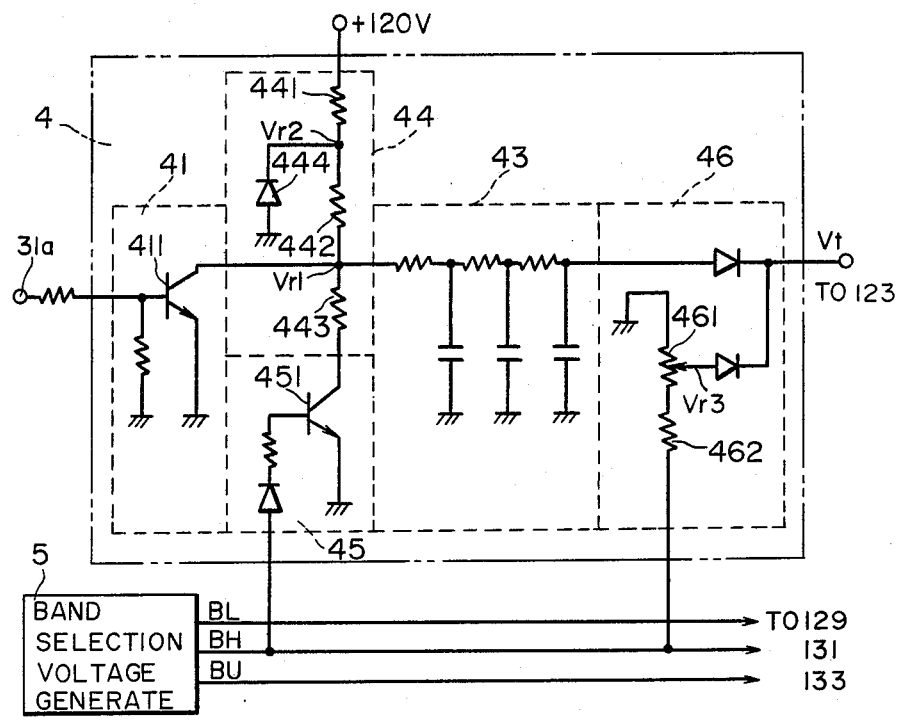
FIG. 14 is a circuit showing a major portion of further preferred embodiment of the present invention.
Figure 15A:
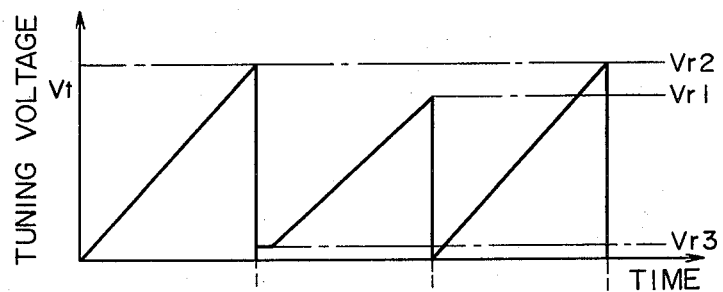
FIGS. 15A and 15B are waveforms for explaining the autosearch operation in FIG. 14 embodiment.
Figure 15B:
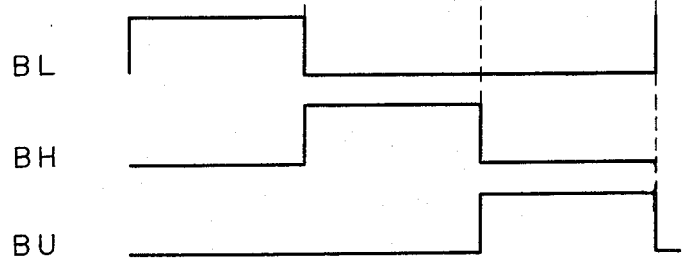
Figure 16:
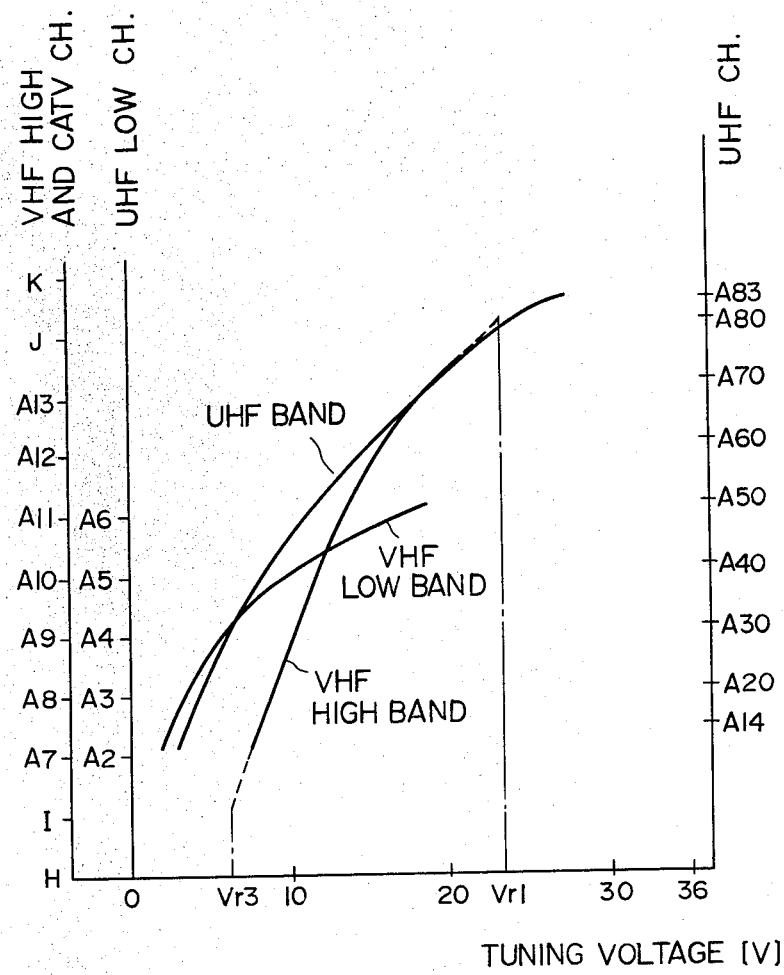
FIG. 16 is a graph showing a relation between the tuning voltage and the receiving channel in FIG. 14 embodiment.

FIG. 14 is a circuit showing a major portion of a further embodiment of the present invention. This embodiment is considered to satisfy the standard of DOC in Canada. This embodiment is different from the FIG. 11 embodiment in that both the switching circuit 45 and the reference voltage generating circuit 46 are connected to one output terminal of the band selection voltage generating circuit 5, from which the voltage BH is outputted. In Canada, as shown in FIGS. 6 and 16, the I channel and the J channel of the CATV band are assigned adjoining the VHF high band. In DOC, in receiving the VHF high band, it is required that receivable frequencies over and below the I channel and the J channel of its CATV band exist. Accordingly, in order to satisfy the standard of DOC in Canada, it is necessary to restrict both the upper limit and the lower limit of the tuning voltage Vt in the VHF high band. This FIG. 14 embodiment makes effective the switching circuit 45 and the reference voltage generating circuit 46 in receiving the VHF high band. In receiving the VHF high band in the FIG. 14 embodiment, as shown in FIGS. 15A and 15B, the tuning voltage Vt varies in the range of Vr3 (approximately 1.5 V) to Vr1 (approximately 23.0 V). Therefore, the FIG. 14 embodiment does not cause the situation where CATV channels other than the I channel and the J channel permitted by the standard of DOC are receivable.

Figure 17:
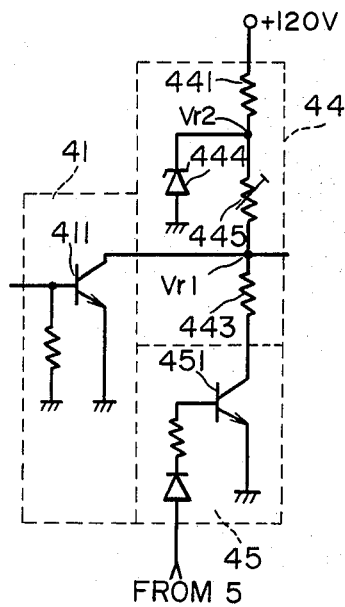
FIGS. 17, 18 and 19 are major circuits showing different modifications of FIG. 11 and FIG. 14, respectively.
Figure 18:
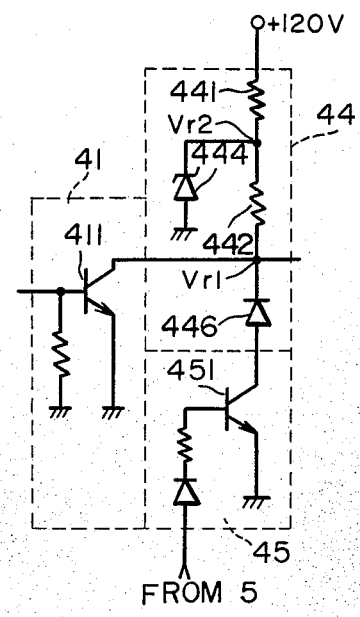

FIGS. 17 and 18 are schematic diagrams of major portions showing different modifications of the reference voltage generating circuit 44, respectively. The FIG. 17 embodiment substitutes a variable resistor or a semi-fixed resistor 445 for the resistor 442 in FIGS. 11 and 14. In such a way, the FIG. 17 embodiment adjusts the first reference voltage Vr1 obtained from the reference voltage generating circuit 44, in the course of manufacturing process, to an arbitrary value by employing the semi-fixed resistor 445.

FIG. 18 embodiment substitutes a constant voltage diode 446 for the resistor 443 constituting the voltage divider in the embodiment shown in FIGS. 11 and 14 (or FIG. 17). In order to generate the reference voltage Vr1, the constant voltage diode 446 is set to the reference voltage Vr1 (for example, 27.5 V) which is a required zener voltage.

Figure 19:
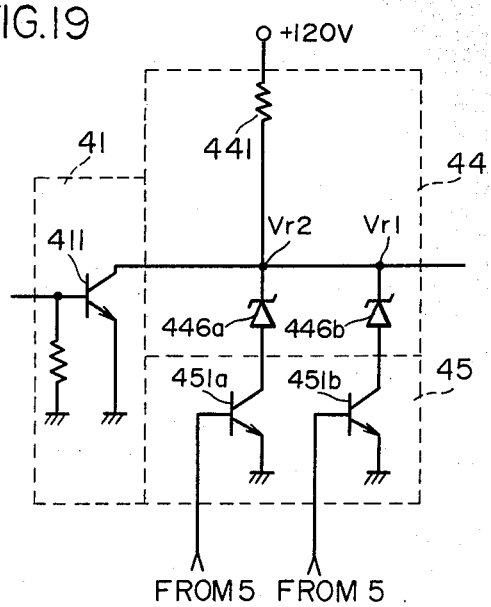

FIG. 19 is a circuit showing a major portion of still a further embodiment of the present invention. All the above described embodiments are adapted to divide the reference voltage Vr2 stabilized by the constant voltage diode 444 by the voltage divider to obtain the first reference voltage Vr1. Over against this, this FIG. 19 embodiment employs a constant voltage diode 446a for generating a relatively higher reference voltage Vr2 and a constant voltage diode 446b for generating a relatively lower reference voltage Vr1. One of transistors 451a and 451b included in the switching circuit 45 is rendered conductive responsive to the voltage BL, BH or BU obtained from the band voltage generating circuit 5 as shown, for example in FIG. 11 or FIG. 14. As a result, a different reference voltage Vr1 or Vr2 can be provided to the voltage converting circuit 41 depending on the receiving band.

In the above described embodiment the information associated with the frequency to be received was represented in terms of the pulse width of an input pulse signal. However, such information may be represented in terms of various dimensions of an input pulse signal, such as the number of pulses, the amplitude of the pulse and so on.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuning voltage generating apparatus of a voltage synthesizer type for supplying a tuning voltage to a tuner employing a variable reactance element as a tuning element, comprising:
   input pulse signal providing means for providing an input pulse signal having information corresponding to a frequency to be received,
   first reference voltage generating means including a voltage dividing means for generating a first reference voltage having a first level,
   voltage converting means responsive to said input pulse signal and said first reference voltage for voltage converting said input pulse signal into an output pulse signal using said first reference voltage, and
   low-pass filter means for converting the voltage converted pulse signal from said voltage converting means into a direct current tuning voltage for application to said tuner, an upper limit of said tuning voltage being determined by said voltage dividing means, wherein
   said tuner is capable of receiving a plurality of frequency bands, and which further comprises
   band selecting means for selecting any one of said plurality of frequency bands,
   second reference voltage generating means having a constant voltage element for generating a second reference voltage having a second level higher than that of said first reference voltage, and
   switching means responsive to an output of said band selecting means for activating either of said first and second reference voltage generating means.

2. A tuning voltage generating apparatus in accordance with claim 1, wherein
   said voltage dividing means comprises a plurality of resistive components connected in a serial fashion.

3. A tuning voltage generating apparatus in accordance with claim 2, wherein
   at least one of said plurality of resistive components comprises a variable resistor.

4. A tuning voltage generating apparatus in accordance with claim 1, wherein
   said second reference voltage generating means comprises a second constant voltage element and a second voltage dividing means for voltage dividing the voltage stabilized by said second constant voltage element by said second voltage dividing means for generating said second reference voltage.

5. A tuning voltage generating apparatus in accordance with claim 1, wherein
   said second reference voltage generating means comprises means for withdrawing as said second reference voltage the voltage stabilized by said constant voltage element included in said first reference voltage generating means.

6. A tuning voltage generating apparatus of a voltage synthesizer type for supplying a tuning voltage to a tuner employing a variable reactance element as a tuning element, comprising:
   input pulse signal providing means for providing an input pulse signal having information encoded therein corresponding to a frequency to be received,
   first reference voltage generating means including a voltage dividing means for generating a first reference voltage having a first level by dividing an output of a constant voltage source by said voltage dividing means,
   voltage converting means responsive to said input pulse signal and said first reference voltage for voltage converting said input pulse signal into an output pulse signal using said first reference voltage,
   low-pass filter means for converting the voltage converted pulse signal from said voltage converting means into a direct current tuning voltage for application to said tuner, an upper limit of said tuning voltage being determined by said voltage dividing means, and lower limit determing means comprising a reference voltage generating circuit for determining a lower limit of the tuning voltage from said low-pass filter means.

7. A tuning voltage generating apparatus of a voltage synthesizer type for supplying a tuning voltage to a tuner employing a variable reactance element as a tuning element, comprising:

input pulse signal providing means for providing an input pulse signal having a pulse width corresponding to a frequency to be received, reference voltage generating means for generating first and second reference voltages having at least two different levels, voltage converting means responsive to said input pulse signal and a reference voltage from said reference voltage generating means for voltage converting said input pulse signal to an output pulse signal, low-pass filter means for converting the output pulse signal from said voltage converting means into a direct current tuning voltage for application to said tuner, an upper limit of said tuning voltage being determined by at least one of said first and second reference voltages from said reference voltage generating means, and means for providing only the relatively lower level reference voltage of said first and second reference voltages to said voltage converting means.

8. A tuning voltage generating apparatus in accordance with claim 7, wherein said tuner is capable of receiving a plurality of frequency bands, and which further comprises band selecting means for selecting any one of said plurality of frequency bands, and switching means responsive to an output from said band selecting means for providing either of the first and second reference voltages from said reference voltage generating means to said voltage converting means.

9. A tuning voltage generating apparatus in accordance with claim 7, wherein said reference voltage generating means comprises a first constant voltage element for generating said first reference voltage and a second constant voltage element for generating said second reference voltage.

10. A tuning voltage generating apparatus in accordance with claim 9, which further comprises switching means for providing either of the first and second reference voltages from said reference voltage generating means to said voltage converting means, said switching means comprising means for enabling either of said first and second constant voltage elements.

* * * * *